United States Patent

Kim

(10) Patent No.: US 8,599,825 B2
(45) Date of Patent: Dec. 3, 2013

(54) SYSTEM CLOCK SYNCHRONIZATION APPARATUS AND METHOD FOR MOBILE COMMUNICATION SYSTEM

(75) Inventor: Keun Bok Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 988 days.

(21) Appl. No.: 12/586,762

(22) Filed: Sep. 28, 2009

(65) Prior Publication Data

US 2010/0080210 A1    Apr. 1, 2010

(30) Foreign Application Priority Data

Sep. 29, 2008    (KR) .......................... 10-2008-0095104

(51) Int. Cl.
*H04J 3/06* (2006.01)
*H04B 7/19* (2006.01)

(52) U.S. Cl.
USPC ........................................ 370/350; 455/13.2

(58) Field of Classification Search
USPC .......................................................... 370/350
See application file for complete search history.

(56) References Cited

U.S. PATENT DOCUMENTS

| | | | | |
|---|---|---|---|---|
| 5,893,044 A * | 4/1999 | King et al. | ..................... | 701/478 |
| 5,933,058 A * | 8/1999 | Pinto et al. | ....................... | 331/17 |
| 6,611,920 B1 * | 8/2003 | Fletcher et al. | ............... | 713/322 |
| 7,411,937 B2 * | 8/2008 | Guilford | ....................... | 370/350 |
| 8,374,075 B2 * | 2/2013 | Bogdan | ......................... | 370/210 |
| 8,457,103 B2 * | 6/2013 | Neumann et al. | .............. | 370/350 |
| 2001/0009856 A1 * | 7/2001 | Kang et al. | ..................... | 455/456 |
| 2007/0194829 A1 * | 8/2007 | Duvillard et al. | ............. | 327/291 |
| 2007/0296632 A1 * | 12/2007 | Opshaug | ....................... | 342/450 |

* cited by examiner

*Primary Examiner* — Guang Li (57) ABSTRACT

A system clock synchronization apparatus, for use in a mobile communication system, supplies a GPS clock received from a GPS reception module to a Radio Frequency clock generation module and selects a candidate system clock. The candidate system clock is selected from among plural candidate system clocks having different phases, which can be most stably synchronized with a reference synchronization time signal as the final system clock. The apparatus includes a Global Positioning System reception module; a Radio Frequency clock generation module that generates a system reference clock and outputs an RF clock generated by synchronizing the system reference clock to the GPS clock in phase; and a system clock generation module that generates multiple candidate system clocks having different phases using the RF clock and selects one of the candidate system clocks which generates in a range of an enable duration of the reference synchronization time signal.

20 Claims, 7 Drawing Sheets

DCBA
"0111" --> B (B)

DCBA
"1101" --> D (C)

DCBA
"1011" --> A (D)

DCBA
"1110" --> C

SYSTEM CLOCK SYNCHRONIZATION APPARATUS AND METHOD FOR MOBILE COMMUNICATION SYSTEM

CROSS-REFERENCE TO RELATED APPLICATION(S) AND CLAIM OF PRIORITY

The present application is related to and claims priority to an application entitled "SYSTEM CLOCK SYNCHRONIZATION APPARATUS AND METHOD FOR MOBILE COMMUNICATION SYSTEM" filed in the Korean Intellectual Property Office on Sep. 29, 2008 and assigned Serial No. 10-2008-0095104, the contents of which are incorporated herein by reference.

TECHNICAL FIELD OF THE INVENTION

The present invention relates to a mobile communication system and, in particular, to a system clock synchronization method and apparatus for a mobile communication system in which a Global Positioning System (GPS) clock output by a GPS reception module is directly supplied to a Radio Frequency (RF) clock generation module, and a candidate system clock, among plural candidate system clocks having different phases, which can be most stably synchronized with a reference synchronization time signal is selected as the final system clock.

BACKGROUND OF THE INVENTION

In mobile communication systems, a channel card is configured to use different system clocks depending on the Bandwidth (BW). For instance, 500 MHz system clock is used for 8.75 MHz BW, 56 MHz system clock for 10 MHz BW, and 44.8 MHz system clock for 5 MHz BW. In a picocell channel card of WiBro system, 44.8 MHz system clock is used.

Meanwhile, a radio communication apparatus includes an RF block and a digital block. Typically, the RF block uses a system clock which minimizes the phase noise, and the digital block is designed to acquire stable Pulse per 2 Seconds (PP2S) signal, which is a reference signal for data processing. The 44.8 MHz system clock, used in the WiBro picocell, is locked based on the GPS clock (10 MHz in general) received from GPS satellites. In this case, however, the frequency of the 10 Mhz GPS clock is not an integer multiple of the 44.8 Mhz used in the WiBro picocell channel card, whereby the phase of 10 Mhz GPS signal is not accurately synchronized to that of the 44.8 Mhz.

In order to overcome this problem, an additional logic is used for converting the 10 MHz frequency of GPS signal to an integer multiple of the system reference clock of 44.8 MHz used in the WiBro picocell channel card. However, this conventional method has drawbacks in that the additional logic is likely to distort the reference frequency clock output by the GPS reception module so as to degrade the quality of the system clock and increases whole manufacturing costs.

SUMMARY OF THE INVENTION

To address the above-discussed deficiencies of the prior art, it is a primary object to provide a system clock synchronization apparatus and method for a mobile communication system that enables a system clock generation module to generates a system clock using the GPS frequency directly output from a GPS reception module.

Additionally, the present invention provides a system clock synchronization apparatus and method for a mobile communication system that is capable of improving the stability of the system clock by generating plural candidate system clocks having different phases and selecting one, among the candidate system clocks, which is most stably synchronized with the PP2S of the digital block as the system clock.

In accordance with an exemplary embodiment of the present invention, a system clock synchronization apparatus of a mobile communication system includes a Global Positioning System (GPS) reception module that outputs a GPS clock and a reference synchronization time signal; a Radio Frequency (RF) clock generation module that generates a system reference clock and outputs an RF clock generated by synchronizing the system reference clock to the GPS clock in phase; and a system clock generation module that generates multiple candidate system clocks having different phases using the RF clock and selects one of the candidate system clocks that generates in a range of an enable duration of the reference synchronization time signal. Preferably, the system clock selector selects the candidate system clock generated in the middle of the range of the enable duration of the reference synchronization time signal as the final system clock. Preferably, the system clock selector determines the final system clock based on values of flag registers designated for the multiple candidate system clocks.

In accordance with another exemplary embodiment of the present invention, a system clock synchronization method for a mobile communication system includes outputting, at a Global Positioning System (GPS) reception module, a GPS clock and a reference synchronization time signal; generating, at an Radio Frequency (RF) clock generation module, a system reference clock and outputting an RF clock generated by synchronizing the system reference clock to the GPS clock; generating, at a candidate system clock generator, multiple candidate system clocks having different phases using the RF clock; and selecting, at a system clock selector, one of the candidate system clocks that is generated in a range of an enable duration of the reference synchronization time signal as a final system clock.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1A through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication network. First, the terms used in the following description are defined herein.

A GPS clock refers to a pulse signal received periodically from a GPS satellite at 10 MHz frequency in general.

A reference synchronization time signal refers to a pulse signal output at a predetermined frequency and referred by the digital block of the mobile communication system for processing data.

A system reference clock refers to a data processing clock that is not divided by an integer multiple of the reference synchronization time signal and the GPS clock output from the GPS reception module. In an exemplary embodiment of the present invention, the system reference clock can output the reference signal at the frequency of 44.8 MHz or 56 Mhz.

Candidate system clocks are the signals having different phases obtained by shifting the phase of an RF clock for synchronizing the RF clock and the reference synchronization time signal.

A system clock refers to a signal selected among the candidate system clocks for used in the digital block finally.

Exemplary embodiments of the present invention are described with reference to the accompanying drawings in detail. The same reference numbers are used throughout the drawings to refer to the same or like parts. Detailed descriptions of well-known functions and structures incorporated herein may be omitted to avoid obscuring the subject matter of the present invention.

Figure 1A:
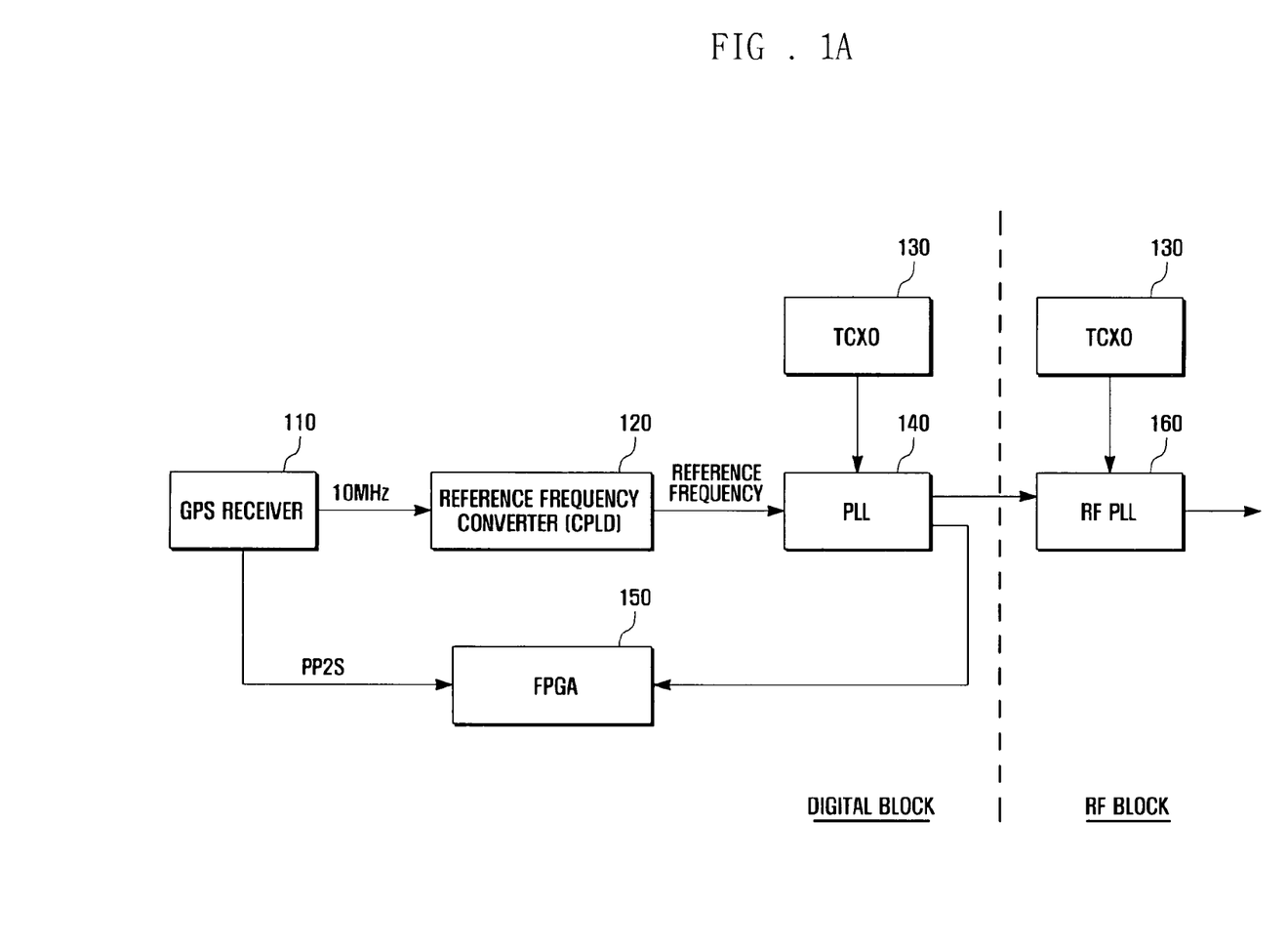
FIG. 1A illustrates a block diagram for a configuration of a conventional system clock generation apparatus for use in a picocell of a WiBro system.

FIG. 1A illustrates a block diagram for a configuration of a conventional system clock generation apparatus for use in a picocell of a WiBro system. The conventional system clock generation apparatus includes a GPS receiver 110, a reference frequency converter 120, an oscillator 130, a Phase Lock Loop (PLL) 140, and a Field Programmable Gate Array (FPGA) 150.

The GPS receiver 110 receives a Time-Of-Day (TOD), GPS clock (10 MHz), and 1 Pulse per Second (1PPS) and generates a reference synchronization time signal. The reference synchronization time signal can be the Pulse per 2 Seconds (PP2S).

Figure 1B:
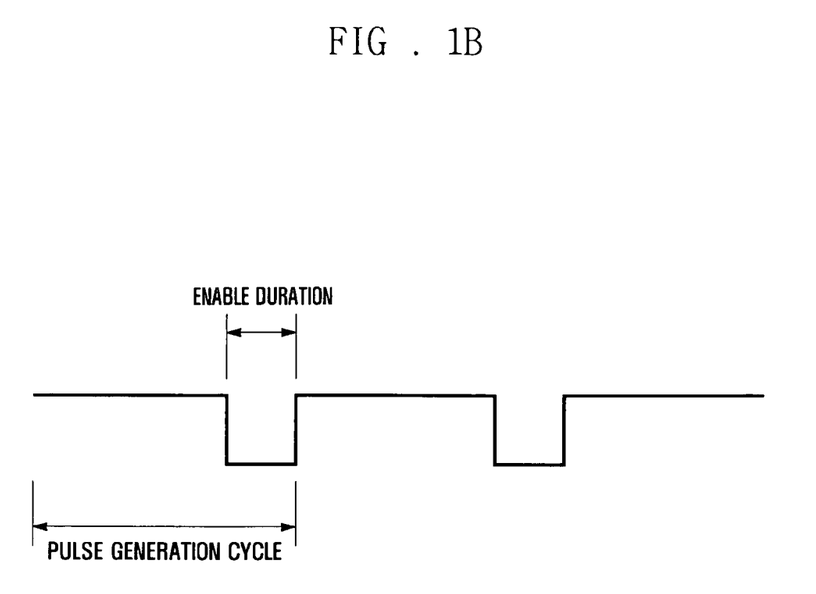
FIG. 1B illustrates a diagram for a waveform of a reference synchronization time signal generated in the conventional system clock generation apparatus of FIG. 1A.

FIG. 1B illustrates a diagram for a waveform of a reference synchronization time signal generated in the conventional system clock generation apparatus of FIG. 1A.

As shown in FIG. 1B, the reference synchronization time signal is generated with a pulse generation cycle having an enable duration, and the pulse generated within the enable duration. When the reference synchronization time signal is the PP2S, the pulse generation cycle is 2 seconds.

Returning to FIG. 1A, the reference frequency converter 120 is a logic device added to avoid a phase mismatch between the GPS clock and the system clock at power-on because the GPS clock is not integer multiple of the system clock. The reference frequency converter 120 receives the GPS clock output by the GPS receiver 110 and converts the GPS clock to a signal to be synchronized with the system reference clock generated by the oscillator 140 in frequency. That is, the reference frequency converter 120 converts the 10 MHz GPS clock output by the GPS receiver 110 into a signal having an integer-multiple frequency (e.g. 400 kHz) of the system clock of the WiBro picocell.

The oscillator 130 is a circuit to generate a periodic signal by developing a specific frequency component. Particularly in an exemplary embodiment of the present invention, the oscillator 130 can be a Temperature Compensated Crystal Oscillator (TCXO) that reduces frequency deviation by maintaining the internal temperature of the crystal oscillator stably. The system reference clock of the WiBro picocell that is generated by the oscillator 130 is transported to the PLL 140 of the digital block and the RF PLL 160 of the RF block.

The PLL 140 of the digital block receives the reference frequency output by the reference frequency converter 120 and the system reference clock output by the oscillator 130. The PLL 140 synchronizes the system reference clock generated by the oscillator 130 on the basis of the frequency of 400 kHz to the system clock and outputs the synchronized system clock to the FPGA 150 and the RF PLL 160.

The FPGA 150 is an integrated circuit that can be configured by the customer. The FPGA 150 receives the PP2S signal output by the GPS receiver 110 and the synchronized system clock output by the PLL 140 and generates a system clock for use in the digital block.

The RF PLL 160 receives the synchronized system clock output by the PLL 140 of the digital block and the system reference clock output by the oscillator 130 and generates a system clock for use in the RF block.

In the conventional system clock generation apparatus as shown in FIG. 1A, the 10 MHz GPS clock output by the GPS receiver 110 can be distorted passing through the reference frequency converter 120 as an additional logic device. Also, the addition of the reference frequency converter 120 causes an increase in the manufacturing cost.

In order to solve these problems of the conventional system clock generation apparatus, the present invention proposes a system clock generation technique in which the GPS clock output by the GPS receiver is directly supplied to an RF clock generation module. In addition, the present invention proposes a system clock generation technique in which one of the plural candidate system clocks having different phases is selected as the system clock of the digital block.

Figure 2:
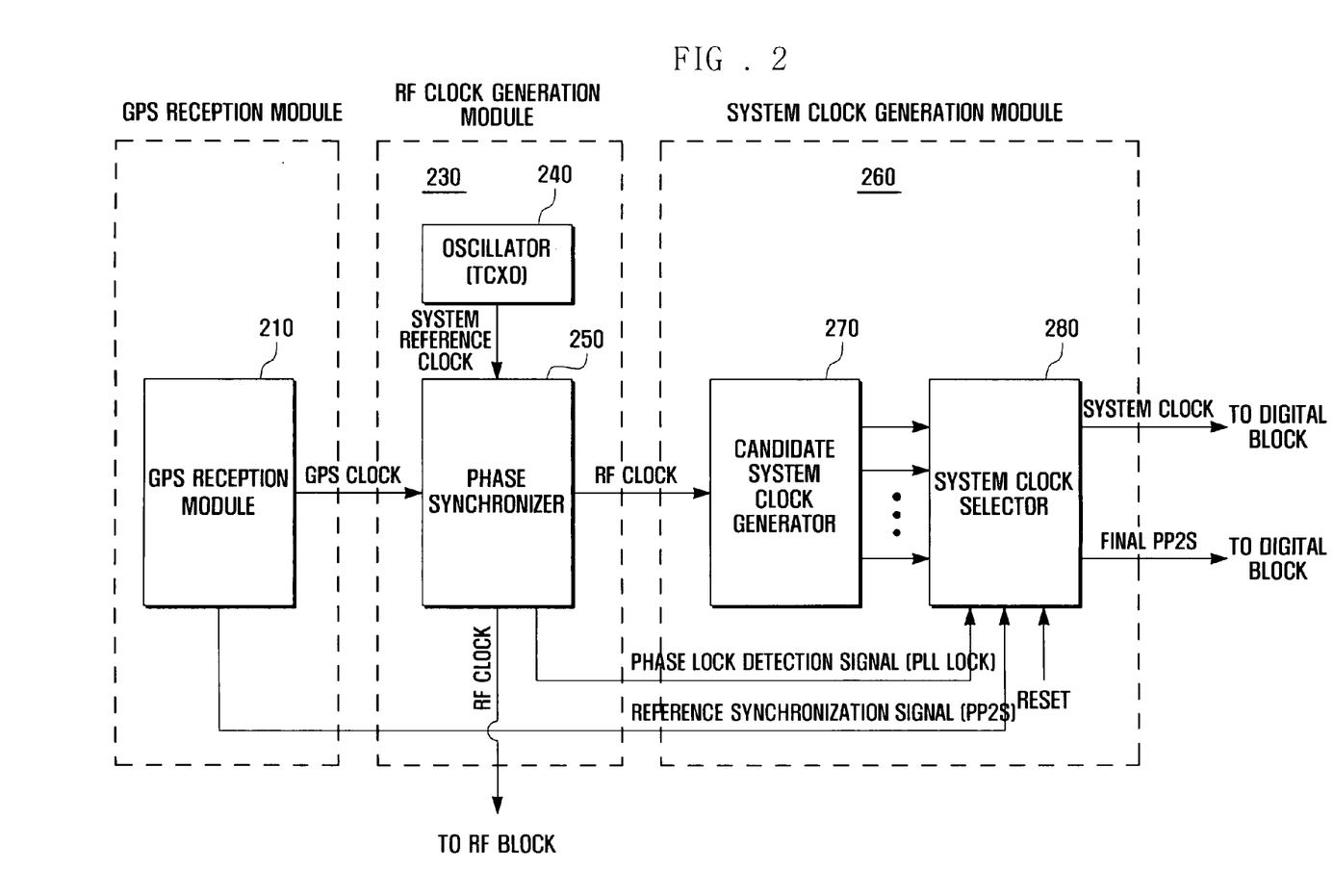
FIG. 2 illustrates a block diagram for a configuration of a system clock synchronization apparatus according to an exemplary embodiment of the present invention.

FIG. 2 illustrates a block diagram for a configuration of a system clock synchronization apparatus according to an exemplary embodiment of the present invention. The system clock synchronization apparatus includes a GPS reception module 210, an RF clock generation module 230, and a system clock generation module 260. The RF clock generation module 230 includes an oscillator 240 and a phase synchronizer 250. The system clock generation module 260 includes a candidate system clock generator 270 and a system clock selector 280.

As described herein above, the GPS reception module 210 receives the Time-Of-Day (TOD), GPS clock, and 1 Pulse per Second (1PPS) signals. In an exemplary embodiment of the present invention, the GPS clock can be a 10 MHz signal. The GPS reception module 210 generates a PP2S signal based on the GPS clock and time clock. The PP2S signal can be a reference signal for the digital blocks of the network entities to process data in the mobile communication system.

The GPS reception module 210 transfers the GPS clock received from a GPS satellite to the RF clock generation module 230. The PP2S signal generated based on the GPS clock and time clock can be output to the system clock generation module 260.

The RF clock generation module 230 generates the RF clock and supplies the RF clock to the RF block and system clock generation module 260. The RF clock output to the system clock generation module 260 is converted into multiple candidate system clocks. The process for converting the RF clock into the candidate system clocks is described herein below. The RF clock generation module includes the oscillator 240 and the phase synchronizer 250.

The oscillator 240 generates a system reference clock used in the mobile communication. In an exemplary embodiment of the present invention, the oscillator 240 can be a Temperature Compensated crystal Oscillator (TCXO). When the system reference clock is the one for used in the WiBro picocell, the oscillator 240 is configured to generate the system reference clock of 44.8 MHz.

The phase synchronizer 250 can be a Phase Locked Loop (PLL) that receives the GPS clock output by the GPS reception module 210 and the system reference clock output by the oscillator 240 and synchronizes the system reference clock to the GPS clock. The system reference clock synchronized to the GPS clock is referenced as the RF clock hereinafter.

The phase synchronizer 250 can include a phase comparison circuit and voltage controlled oscillator (not shown). The GPS clock and the system reference clock input to the phase synchronizer 250 are compared with each other in phase by the phase comparison circuit. A Direct Current (DC) voltage, proportional to the phase deviation, can be acquired by using an RC filter. The DC voltage is input to the voltage controlled oscillator such that the GPS clock and the system reference clock can be synchronized by adjusting the output frequency of the voltage controlled oscillator by as much as the phase difference.

The RF clock generated by the phase synchronizer 250 can be supplied to the RF block. The RF clock is not required to be synchronized to the PP2S signal that is a reference signal for processing the data in the digital block, thereby being used in the RF block directly.

When the system clock is synchronized to the GPS clock, the phase synchronizer 250 outputs a phase lock detection signal (PLL Lock) to the system clock generation module 260.

As illustrated herein above, since the GPS clock signal output by the GPS reception module 210 can be directly input to the RF clock generation module 230 in an exemplary embodiment of the present invention, it is possible to improve the quality of RF clock for use in the RF block and reduce the probability of distortion of the GPS clock.

The system clock generation module 260 generates the system clock for the digital blocks except for the RF block and supplies the system clock to the digital blocks. The system clock generation module 260 includes the candidate system clock generator 270 and the system clock selector 280.

Although the RF clock generation module 230 can output the RF clock obtained by synchronizing the system reference clock to the GPS clock, the system clock, for use in the digital block, can be synchronized with the PP2S output by the GPS reception module 210 again. This is because the PP2S signal is the reference signal for processing the data in the digital block.

Accordingly, the system clock generation module 260 synchronizes the RF clock output by the RF clock generation module 230 to the PP2S signal output by the GPS reception module 210 by means of the candidate system clock generator 270 and the system clock selector 280.

The candidate system clock generator 270 receives the RF clock output by the RF clock generation module 230 and generates a plurality of candidate system clocks having different phases. In an exemplary embodiment of the present invention, 4 candidate system clocks are output in parallel. Although the system clock synchronization is described under the assumption of 4 candidate system clocks having different phases, it will be understood that the number of candidate system clocks are not limited to 4.

Under this assumption, the candidate system clock generator 270 generates a first to fourth candidate system clocks having different phases. The first candidate system clock includes a phase equal to the system reference clock+phase shift "a", the second candidate system clock includes a phase equal to the system reference clock+phase shift "b", the third candidate system clock includes a phase equal to the system clock+phase shift "c", and the fourth candidate system clock includes a phase equal to the system clock+phase shift "d". Here, the phase shifts a, b, c, and d are predetermined time durations. The candidate system clock generator 270 can output the first to fourth candidate system clocks to the system clock selector 280 in parallel.

The system clock selector 280 receives the candidate system clocks having different phases, the phase lock detection signal (PLL Lock), the PP2S signal, and a reset signal.

Here, the candidate system clocks having different phases are generated by shifting the system reference clock. The phase lock detection signal is a signal for indicating the synchronization of the system reference clock to the GPS clock in the phase synchronizer 250 and determines the initial state of the system clock generation module 260. The PP2S signal is generated by the GPS reception module 210 and is a reference signal for the processing operation of the digital block. The reset signal is a signal for indicating the power-on of the mobile communication system after power-off and determines the initial state of the system clock generation module 260 together with the phase lock detection signal.

When the phase lock detection signal or the reset signal is input, the system clock selector 280 selects one of the candidate system clocks as the system clock. The system clock selection process is described in detail with reference to FIG. 3.

Figure 3:
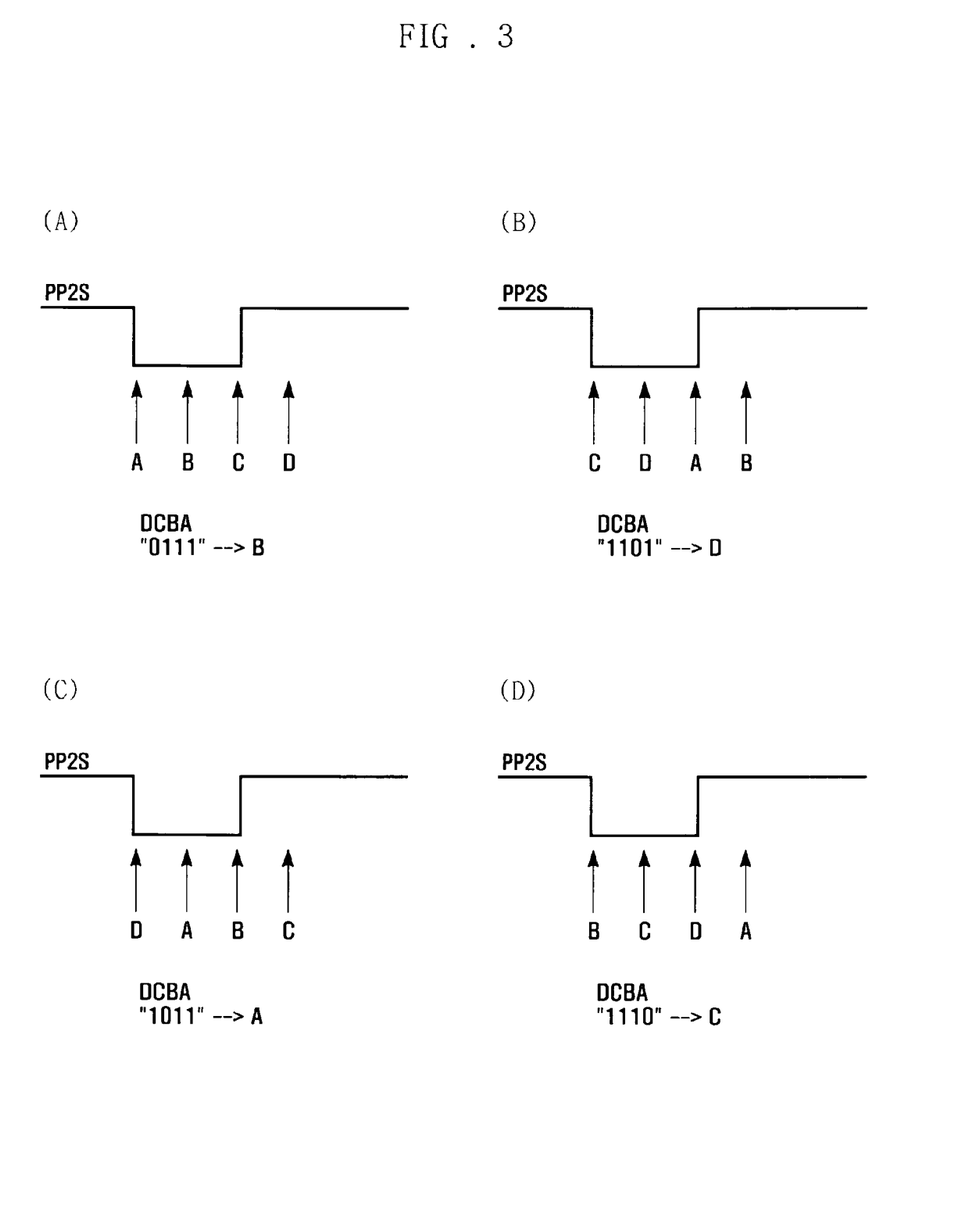
FIG. 3 illustrates diagrams for how the system clock selector of FIG. 2 selects one of candidate system clocks having different phases as the system clock.

FIG. 3 illustrates diagrams for how the system clock selector of FIG. 2 select one of candidate system clocks having different phases as the system clock. As illustrated in examples hereinabove, it is assumed that 4 candidate system clocks are generated by the candidate system clock selector.

In accordance with an exemplary embodiment of the present invention, the system clock selector 280 is configured to select the candidate system clock signal generates in the middle of the enable duration of the PP2S signal. Particularly, the system clock selector 280 selects the system clock to be used in the digital block according to the values of flag registers designated for the respective candidate system clocks.

The system clock selector 280 receives the first candidate system clock "A", the second candidate system clock "B", the third candidate system clock "C", and the fourth candidate system clock "D" output by the candidate system clock generator 270, and the PP2S signal output by the GPS reception module 210. The system clock selector 280 checks the generation time points of the first to fourth candidate system clocks in relation to the enable duration of the PP2S and selects one of the candidate system clocks as the system clock to be used in the digital block.

The reference numeral (A) shows a situation in which the first to third candidate system clocks occur during in the range of the enable duration of the PP2S signal (duration in which the PP2S signal is low).

The system clock selector 280 sets the flag registers designated for the candidate system clocks in the range of the enable duration of the PP2S signal to "1". The system clock selector 280 sets the flag register designated for the candidate system clock out of the range of the enable duration of the PP2S signal to "0".

Referring to the exemplary situation (A) of FIG. 3, since the first to third candidate system clocks are in the range of the enable duration of the PP2S signal, the flag registers designated for the first to third candidate system clocks A, B, and C are set to "1", and the flag register designated for the fourth candidate system clock D is set to "0". Further, the values of the flag registers of the first to fourth candidate system clocks can be aligned in inverse order, e.g., DCBA=0111.

When the inversely aligned flag register values of the candidate system clocks are "0111", the second candidate system clock B is selected as the system clock for use in the digital block. This is because the first candidate system clock and the third candidate system clock occur at the boundary of the enable duration of the PP2S signal and cannot be detected in case when the PP2S signal transits from a state to another. However, the second candidate system clock occurs in the middle of the enable duration of the PP2S signal and can be detected stably even when the PP2S signal transits.

That is, since the first candidate system clock A is generated at the time point when the pulse of the PP2S signal transits from the high state to the low state, the pulse may not be detected. Similarly, since the third candidate system clock C is generated at the time point when the pulse of the PP2S signal transits from the low state to the high state, the pulse may not be detected. Whereas, since the second candidate system clock occurs while the pulse of the PP2S signal maintains the low state, the pulse can be detected stably at time point of the second candidate system clock.

In the exemplary situation (B) of FIG. 3, the flag registers designated for the first, third, and fourth candidate system clocks are set to "1", and the flag register designated for the second candidate system clock is set to "0". The flag register values of the first to fourth candidate system clocks can be aligned in inverse order, thus DCBA=1101.

When the inversely aligned flag register values of the candidate system clocks are "1101", the fourth candidate system clock D is selected as the system clock for use in the digital block. This is because the time point at which the fourth candidate system clock D is generated is in the middle of the enable duration of the PP2S so as to stably detect the PP2S signal even though the first, third, and fourth candidate system clocks are in the range of the enable duration of the PP2S signal.

In the exemplary situation (C) of FIG. 3, the flag registers designated for the first, second, and fourth candidate system clocks are set to "1", and the flag register designated for the third candidate system clock is set to "0". The flag register values of the first to fourth candidate system clocks aligned in inverse order are DCBA=1011.

When the inversely aligned flag register values of the candidate system clocks are "1011", the first candidate system clock A is selected as the system clock for use in the digital block. This is because the time point at which the first candidate system clock A is generated is in the middle of the enable duration of the PP2S signal so as to stably detect the PP2S signal even though the first, second, and fourth candidate system clocks are in the range of the enable duration of the PP2S signal.

In the exemplary situation (D) of FIG. 3, the flag registers designated for the second to fourth candidate system clocks are set to "1", and the flag register designated for the first candidate system clock is set to "0". The flag register values of the second to fourth candidate system clocks aligned in inverse order are DCBA=1110.

When the inversely aligned flag register values of the candidate system clocks are "1000", the third candidate system clock C is selected as the system clock for use in the digital block. This is because the time point at which the third candidate system clock C is generated is in the middle of the enable duration of the PP2S signal so as to stably detect the PP2S signal even though the second to fourth candidate system clocks are in the range of the enable duration of the PP2S signal.

Returning back to FIG. 2, the system clock selector 280 selects one of the candidate system clocks having different phases that are output by the candidate system clock generator 270 as the system clock of the digital block according to the above described manner.

When selecting the system clock for use in the digital block, the system clock selector 280 synchronizes the enable duration of the PP2S signal and the time point at which the system clock is generated. This synchronization process is described in detail with reference to FIG. 4.

Figure 4:
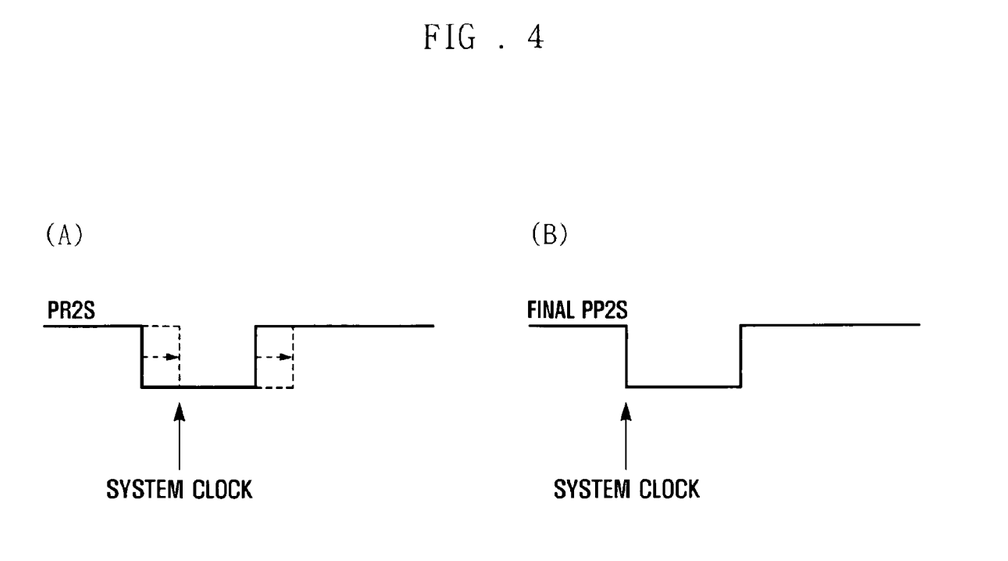
FIG. 4 illustrates a diagram for a synchronization operation of the system clock selector of FIG. 2 for synchronizing the PP2S signal to the system clock selected in the exemplary situation (A) of FIG. 3.

FIG. 4 illustrates a diagram for a synchronization operation of the system clock selector 280 of FIG. 2 for synchronizing the PP2S signal to the system clock selected in the exemplary situation (A) of FIG. 3. In FIG. 4, the system clock selector 280 shifts the PP2S signal such that the start point of the enable duration is synchronized to the time point of the selected system clock as shown in instance (B) of FIG. 4.

As shown in instance (B) of FIG. 4, the final PP2S signal is synchronized to the time point at which the system clock is generated such that the pulse and the system clock are detected.

The system clock and final PP2S signal generated by the system clock selector 280 are supplied to the digital block.

Figure 5:
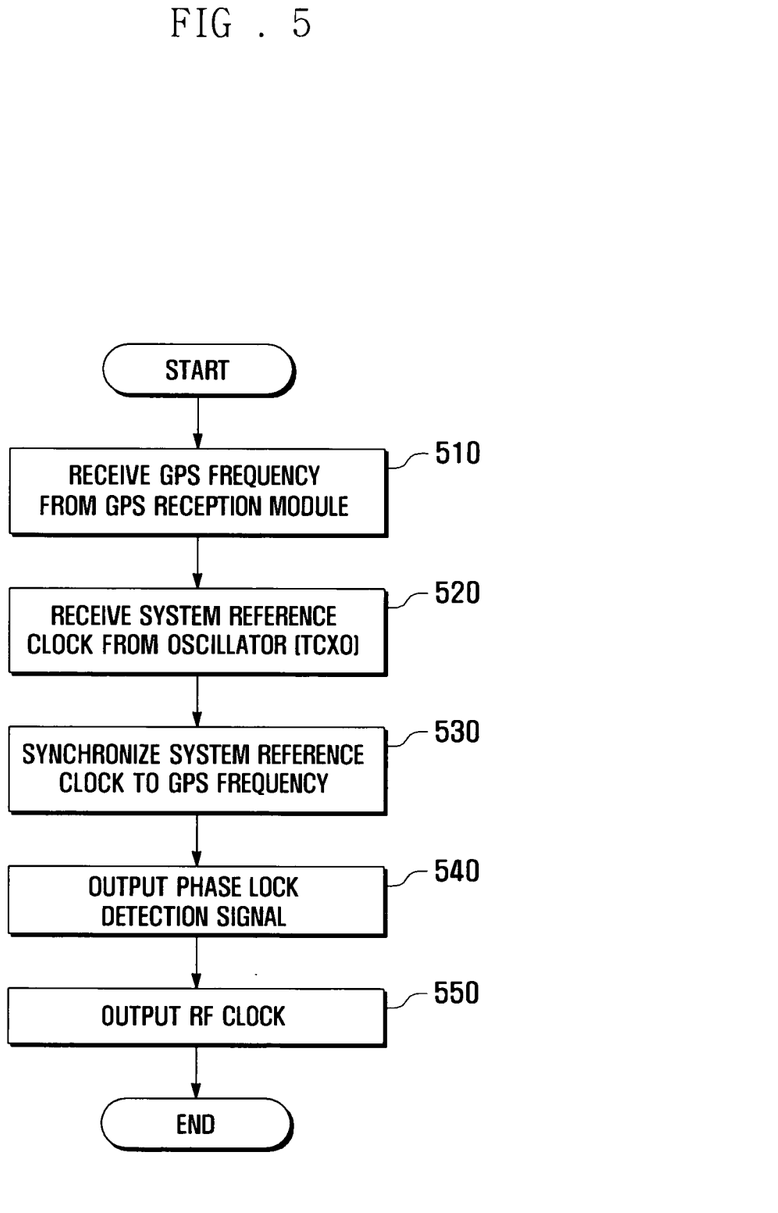
FIG. 5 illustrates a flowchart for an RF clock generation procedure of a system clock synchronization method according to an exemplary embodiment of the present invention.

FIG. 5 illustrates a flowchart for an RF clock generation procedure of a system clock synchronization method according to an exemplary embodiment of the present invention.

In the RF clock generation procedure, the RF clock generation module 230 first receives the GPS clock input by the GPS reception module 210 (510). In an exemplary embodiment of the present invention, the GPS clock is a signal received from the GPS satellite at 10 MHz frequency. Thereafter, the phase synchronizer 250 of the RF clock generation module 230 receives the system reference clock output by the oscillator 240 (520). In an exemplary embodiment of the present invention, the system reference clock can be a frequency clock of 44.8 MHz used in a WiBro picocell.

The phase synchronizer 250 synchronizes the system reference clock output by the oscillator 240 to the GPS clock received by means of the GPS reception module 210 (530).

Once the system reference clock is synchronized to the GPS clock, the phase synchronizer 250 outputs the phase lock detection signal to the system clock generation module 260 (540). The phase lock detection signal is used for determining the initial operation time point of the system clock generation module 260.

Next, the phase synchronizer 250 outputs the system reference clock (RF clock) synchronized to the GPS clock to the RF block and the system clock generation module 260. The RF clock output to the RF block is referred to as the system clock of the RF block, and the RF clock output to the system clock generation module 260 is used for generating multiple candidate system clocks having different phases.

Figure 6:
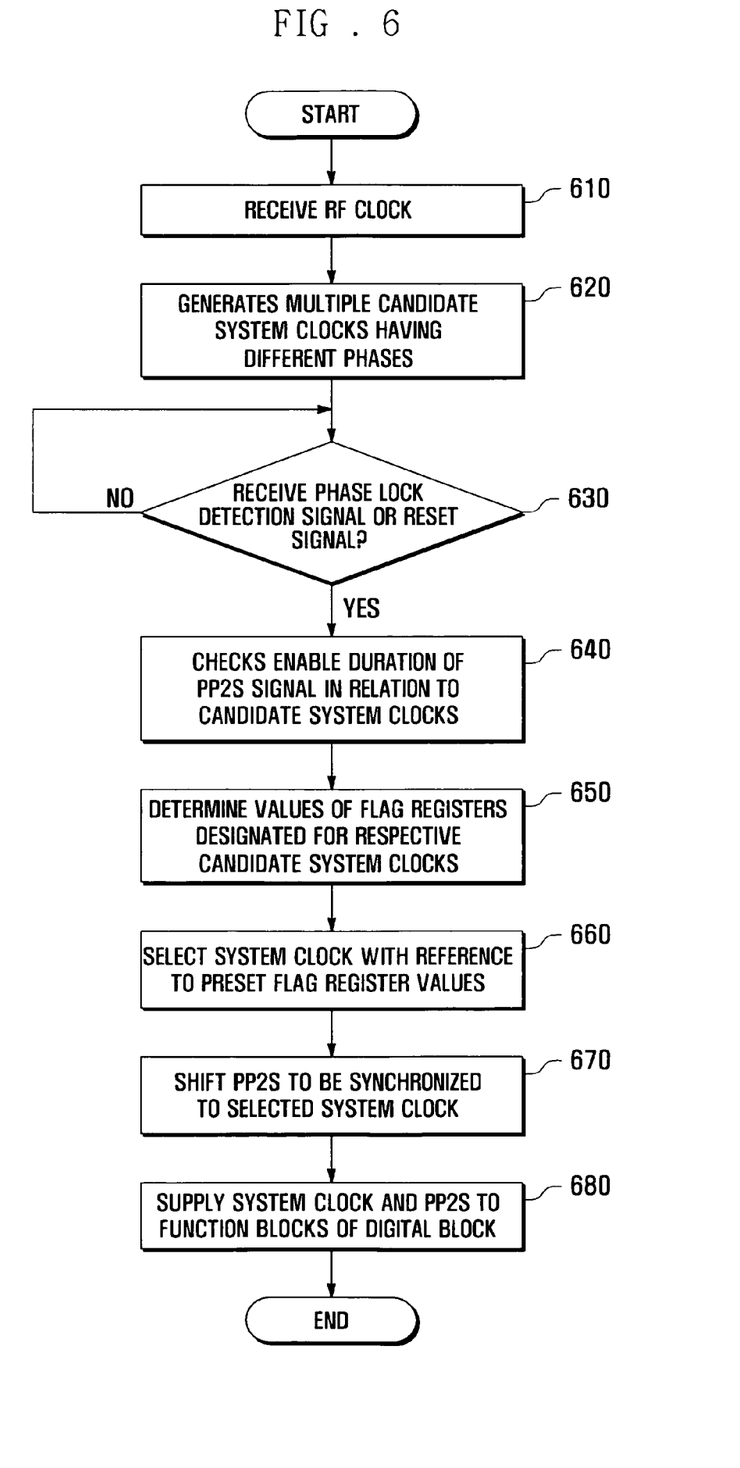
FIG. 6 illustrates a flowchart of a system clock generation procedure of a system clock synchronization method according to an exemplary embodiment of the present invention.

FIG. 6 illustrates a flowchart for a system clock generation procedure of a system clock synchronization method according to an exemplary embodiment of the present invention.

In the system clock generation procedure, the candidate system clock generator 270 receives the RF clock output by the phase synchronizer 250 of the RF clock generation module 230 (610). The RF clock is a signal obtained by synchronizing the system reference clock generated by the oscillator 240 to the GPS clock received by means of the GPS reception module 210. Although the system reference clock is synchronized to the GPS clock, the system reference clock also should be synchronized to the PP2S signal since the data processing in the digital block is performed based on the PP2S signal.

Accordingly, the candidate system clock generator 270 generates plural candidate system clocks having different phases using the RF clock and outputs the candidate system clocks to the system clock selector 280 (620). The candidate system clocks having different phases can be generated by using the PLL of the candidate system clock generator 270.

The system clock selector 280 determines whether a phase lock detection signal or a reset signal is input (630). This is because the system clock selection can be performed after the system reference clock is synchronized to the GPS clock in the RF clock generation module 230.

If a phase lock detection signal or a reset signal is input, the system clock selector 280 checks the enable duration of the PP2S signal in relation to the plural candidate system clocks (640). Thereafter, the system clock selector 280 determines the values of the flag registers designated for the candidate system clocks according to a predetermined flag register value determination policy (650). According to the flag register value determination policy, the flag registers designated for the candidate system clocks generated in the range of the enable duration of the PP2S signal are set to "1", and the flag registers designated for the candidate system clocks generated out of the range of the enable duration of the PP2S are set to "0".

Then, the system clock selector 280 compares the flag register values with reference flag register values and selects one of the candidate system clocks as the final system clock according to the comparison result (660). How to select the final system clock has been described in detail above with reference to FIG. 3.

Once the final system clock is selected, the system clock selector 280 shifts the PP2S signal so as to be synchronized to the final system clock (670).

As a consequence, the system clock selector 280 supplies the final system clock and PP2S signal to the function blocks within the digital block (680).

As described above, the system clock synchronization method and apparatus of the present invention supplies the GPS clock received by means of a GPS reception module to the RF clock generation module without passing through an additional logic device, thereby reducing distortion of the GPS clock and thus generating the RF clock of high quality.

Also, the system clock synchronization method and apparatus of the present invention is advantageous to generate a stable system clock by selecting one of plural candidate system clocks having different phases that is capable of being most stably synchronized with the PP2S signal.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A system clock synchronization apparatus of a mobile communication system, comprising:
   a Global Positioning System (GPS) reception circuitry configured to output a GPS clock and a reference synchronization time signal;
   a Radio Frequency (RF) clock generation circuitry configured to generate a system reference clock and output an RF clock generated by synchronizing the system reference clock to the GPS clock in phase; and
   a system clock generation circuitry configured to generate multiple candidate system clocks having different phases using the RF clock and select one of the candidate system clocks which is generated in a range of an enable duration of the reference synchronization time signal as a final system clock.

2. The system clock synchronization apparatus of claim 1, wherein the system clock generation circuitry comprises:
   a candidate system clock generator configured to generate the multiple candidate system clocks having different phases using the RF clock; and
   a system clock selector configured to select one of the candidate system clocks which is generated in the range of the enable duration of the reference synchronization time signal as the final system clock.

3. The system clock synchronization apparatus of claim 2, wherein the system clock selector is configured to select the candidate system clock generated in the middle of the range of the enable duration of the reference synchronization time signal as the final system clock.

4. The system clock synchronization apparatus of claim 3, wherein the system clock selector is configured to determine the final system clock based on values of flag registers designated for the multiple candidate system clocks.

5. The system clock synchronization apparatus of claim 2, wherein the RF clock generation circuitry is configured to generate a phase lock detection signal, when the RF clock is generated, and output the phase lock detection signal to the system clock selector.

6. The system clock synchronization apparatus of claim 5, wherein the system clock selector is configured to start selecting the final system clock when the phase lock detection signal is received.

7. The system clock synchronization apparatus of claim 2, wherein the system clock selector is configured to output a final reference time signal synchronized to the final system clock.

8. A system clock synchronization method for a mobile communication system, comprising:
- outputting, at a Global Positioning System (GPS) reception module, a GPS clock and a reference synchronization time signal;
- generating, at a Radio Frequency (RF) clock generation module, a system reference clock and outputting an RF clock generated by synchronizing the system reference clock to the GPS clock;
- generating, at a candidate system clock generator, multiple candidate system clocks having different phases using the RF clock; and
- selecting, at a system clock selector, one of the candidate system clocks which is generated in a range of an enable duration of the reference synchronization time signal as a final system clock.

9. The system clock synchronization method of claim 8, wherein the candidate system clock selected as the final system clock is the candidate system clock generated in the middle of the enable duration of the reference synchronization time signal.

10. The system clock synchronization method of claim 9, wherein the final system clock is determined based on values of flag registers designated for the multiple candidate system clocks.

11. The system clock synchronization method of claim 8, further comprising:
- generating, at the RF clock generation module, a phase lock detection signal when the RF clock is generated and outputting the phase lock detection signal to the system clock selector; and
- starting, at the system clock selector, selection of the final system clock when the phase lock detection signal is received.

12. The system clock synchronization method of claim 8, further comprising outputting, at the system clock selector, a final reference time signal synchronized to the final system clock.

13. A mobile communications device comprising:
- at least one antenna;
- a Global Positioning System (GPS) reception circuitry communicatively coupled to the at least one antenna and configured to output a GPS clock and a reference synchronization time signal;
- a Radio Frequency (RF) clock generation circuitry configured to generate a system reference clock and output an RF clock generated by synchronizing the system reference clock to the GPS clock in phase; and
- a system clock generation circuitry configured to generate multiple candidate system clocks having different phases using the RF clock and select one of the candidate system clocks which is generated in a range of an enable duration of the reference synchronization time signal as a final system clock.

14. The device of claim 13, wherein the system clock generation circuitry comprises:
- a candidate system clock generator configured to generate the multiple candidate system clocks having different phases using the RF clock; and
- a system clock selector configured to select one of the candidate system clocks which is generated in the range of the enable duration of the reference synchronization time signal as the final system clock.

15. The device of claim 14, wherein the system clock selector is configured to select the candidate system clock generated in the middle of the range of the enable duration of the reference synchronization time signal as the final system clock.

16. The device of claim 15, wherein the system clock selector is configured to determine the final system clock based on values of flag registers designated for the multiple candidate system clocks.

17. The device of claim 14, wherein the RF clock generation circuitry is configured to generate a phase lock detection signal, when the RF clock is generated, and output the phase lock detection signal to the system clock selector.

18. The device of claim 17, wherein the system clock selector is configured to start selecting the final system clock when the phase lock detection signal is received.

19. The device of claim 14, wherein the system clock selector is configured to output a final reference time signal synchronized to the final system clock.

20. The device of claim 13, wherein said mobile communications device is configured to operate in a picocell of a mobile communications.

* * * * *